United States Patent [19]

Tursky et al.

[11] Patent Number: 5,455,529
[45] Date of Patent: Oct. 3, 1995

[54] CIRCUIT ASSEMBLY FOR POWER SEMICONDUCTORS

[75] Inventors: Werner Tursky, Schwabach; Theo Tovar, Stein, both of Germany

[73] Assignee: Export-Contor Aussenhandelsgesellschaft mbH, Nuremberg, Germany

[21] Appl. No.: 160,961

[22] Filed: Dec. 2, 1993

[30] Foreign Application Priority Data

Dec. 2, 1992 [DE] Germany ............................ 42 40 501.7

[51] Int. Cl.⁶ .................................................. H03K 17/00
[52] U.S. Cl. ........................ 327/100; 327/479; 327/588
[58] Field of Search .......................... 328/24; 307/257, 307/321, 43, 52, 53, 577, 584, 570, 575, 270; 327/100, 389, 432, 434, 479, 494, 495, 588; 363/15, 16, 17

[56] References Cited

U.S. PATENT DOCUMENTS

| | | | |
|---|---|---|---|
| 4,532,443 | 7/1985 | Glennon | 307/584 |
| 5,003,246 | 3/1991 | Nadd | 307/570 |
| 5,004,969 | 4/1991 | Schanin | 307/584 |
| 5,023,493 | 6/1991 | Wrzesinski | 307/257 |
| 5,055,722 | 10/1991 | Latos et al. | 307/570 |
| 5,148,064 | 9/1992 | Kevorkian et al. | 307/584 |
| 5,210,451 | 5/1993 | Grunning et al. | 307/570 |

*Primary Examiner*—Timothy P. Callahan
*Assistant Examiner*—Jeffrey Zweizig
*Attorney, Agent, or Firm*—Peter Jon Gluck; Morrison Law Firm; Vineet Kohli

[57] ABSTRACT

A power semiconductor bridge circuit includes two power semiconductor components connected in series between positive and negative voltage sources. A connection between the two power semiconductor components is connected in common to an unsteady load. The connections between each power semiconductor component and a respective one of the positive and negative voltage sources includes at least two parallel-connected conductors. By reducing the current variation in each conductor, the parallel connections reduce self-induction and thereby voltage spikes due to rapid variations in the unsteady load. In one embodiment, one of the conductors connecting to the positive voltage source is arranged parallel to, and spatially proximate to, one conductor connecting to the negative source and likewise with the conductors connecting to the negative voltage source. In the latter embodiment, a further reduction in induction is obtained.

14 Claims, 1 Drawing Sheet

5,455,529

CIRCUIT ASSEMBLY FOR POWER SEMICONDUCTORS

FIELD OF THE INVENTION

The present invention relates to circuits for power semiconductors, and in particular, to bridge circuits, having two power semiconductor components connected in series between positive and negative voltage sources, with a time-varying load connected in common between the power semiconductor components.

BACKGROUND OF THE INVENTION

Bridge circuits having two power semiconductor components connected in series between positive and negative voltage sources, with an AC load connected in common between the semiconductor components, are known in the art. Such power semiconductor components may include transistors, insulated gate bipolar transistors (IGBTs), circuit components with free-running diodes, or other circuit components.

A circuit configuration known from the present applicant's Offenlegungsschrift (German laid open application) DE-A 41 05 155 8 is such a circuit. The invention of this reference reduces induction in positive and negative power connections by locating the connections in close proximity to each other. As a consequence of the reduction in induction, over-voltage conditions are reduced in proportion to the reduction in induction. The circuit components in this reference have free-running diodes on associated commutation branches.

In European Patent Application EP-A 0 088 924, a semiconductor device of modular design is described in which several mutually connected semiconductor chips are arranged in close spatial proximity to each other.

In European Patent Application EP-A 0 277 546 a semiconductor device having at least one semiconductor body with leads that are spatially proximate and at least partly parallel. The spatial arrangement of the conductors provides low-inductance.

In a power semiconductor device connected to a rapidly varying load, self-inductance and mutual inductance of internal components can cause serious over-voltage which may result in destruction of circuit components. This is a significant problem in prior art power semiconductor devices.

OBJECTS AND SUMMARY OF THE INVENTION

An object of the present invention is to overcome the drawbacks of the prior art.

Another object of the present invention is to provide a circuit configuration for a power semiconductor device capable of preventing over-voltage in internal components of the device.

Still another object of the present invention is to prevent destruction of power semiconductor device circuit elements due to voltage spikes caused by rapidly varying loads.

Briefly stated, the present invention provides a power semiconductor bridge circuit including two power semiconductor components connected in series between positive and negative voltage sources. A connection between the two power semiconductor components is connected in common to an unsteady load. The connections between each power semiconductor component and a respective one of the positive and negative voltage sources includes at least two parallel-connected conductors. By reducing the current variation in each conductor, the parallel connections reduce self-induction and thereby voltage spikes due to rapid variations in the unsteady load. In one embodiment, one of the conductors connecting to the positive voltage source is arranged parallel to, and spatially proximate to, one conductor connecting to the negative source and likewise with the conductors connecting to the negative voltage source. In the latter embodiment, a further reduction in induction is obtained.

According to an embodiment of the present invention, there is disclosed, a power semiconductor device, comprising: a first power semiconductor component having a first terminal and a second terminal, a first connection between the first terminal and a negative voltage source, a second power semiconductor component having a third terminal and a fourth terminal, a second connection between the third terminal and a positive terminal of a voltage source, the second and fourth terminals being connected in common to an unsteady load, the first connection including at least two separate conductors, connected in parallel between the first terminal and the negative voltage source and the second connection including at least two other separate conductors, connected in parallel between the third terminal and the positive voltage source.

According to another embodiment of the present invention, there is disclosed, a power semiconductor bridge circuit, comprising: a first power semiconductor component having a first terminal and a second terminal, a second power semiconductor component having a third terminal and a fourth terminal, the second and fourth terminals being connected in common to an unsteady load, a first conductive element connected at ends thereof to a negative voltage source, a second conductive element connected at ends thereof to a positive voltage source, the first conductive dement being connected at an intermediate point thereof to the first terminal, the second conductive element being connected at an intermediate point thereof to the third terminal, the first and second conductive element being substantially parallel to each other and the first and second conductive elements being positioned between the first and second power semiconductor components.

According to still another embodiment of the present invention, there is disclosed, a power semiconductor bridge circuit, comprising: a first power semiconductor component having a first terminal and a second terminal, a second power semiconductor component having a third terminal and a fourth terminal, the second and fourth terminals being connected in common to an unsteady load, first and second conductive elements connected at respective first ends thereof to a negative voltage source, third and fourth conductive elements connected at respective first ends thereof to a positive voltage source, the first and third conductive elements being connected at respective second ends thereof to the first terminal, the second and fourth conductive elements being connected at respective second ends thereof to the third terminal, the first, second, third and fourth conductive element being substantially parallel, the first ends of the first and third conductive elements being located in opposite directions with respect to the first terminal, the first ends of the second and fourth conductive elements being located in opposite directions with respect to the third terminal, the first and third conductive elements lying substantially along a first line, the second and fourth conductive elements lying substantially along a second line and the first and second lines being between the first and second power semiconductor components and substantially perpendicular to a third line joining the first and second semiconductor components.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
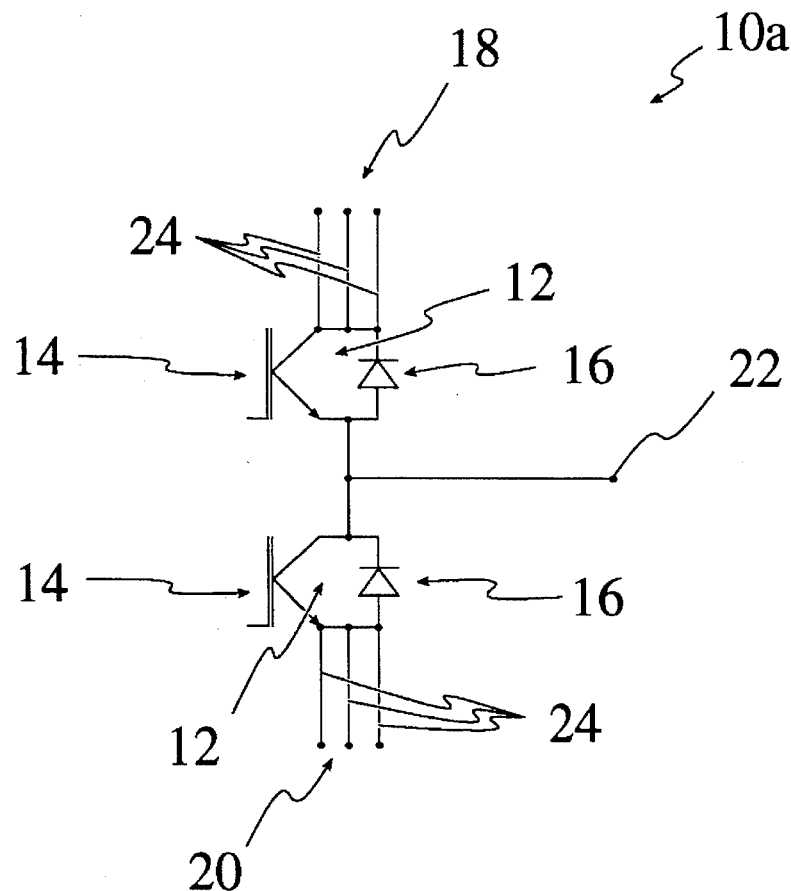
FIG. 1 shows a first embodiment of the circuit arrangement for power semiconductor components.

FIG. 1 shows a bridge circuit 10a with two power semiconductor components 12. Power semiconductor components 12 are connected in common to an AC load at AC load connection 22. Power semiconductor components 12 are connected in series between positive and negative power connections 18 and 20 of a DC voltage source. Power semiconductor components 12 may include transistors, insulated gate bipolar transistors 14 (IGBTs), diodes 16, circuit components with free-running diodes 16, or other circuit components.

In bridge circuit 10a of FIG. 1, power connection 18 includes three separate partial connections 24. Similarly, power connection 20 includes three separate partial connections 24. Induction caused by self-inductance of the three partial connections is lower than that of a single conductor. The effect of having positive and negative power connections 18 and 20 include three partial connections 24 is to reduce by two-thirds, the total current per partial connection 24 compared to a single conductor. This reduction of current results in a corresponding reduction in the rate of change of current per unit time in each partial connection 24 when a time-varying current exists in power connections 18 and 20. Consequently, the inductive voltage drop in each conductor also falls by two-thirds. The inductive over-Voltage also drops by two-thirds as compared to a circuit with a single conductor. A consequence of the reduction in over-voltage is to lower the potential for destruction of circuit components such as IGBTs 14 or free-running diodes 16.

Figure 2:
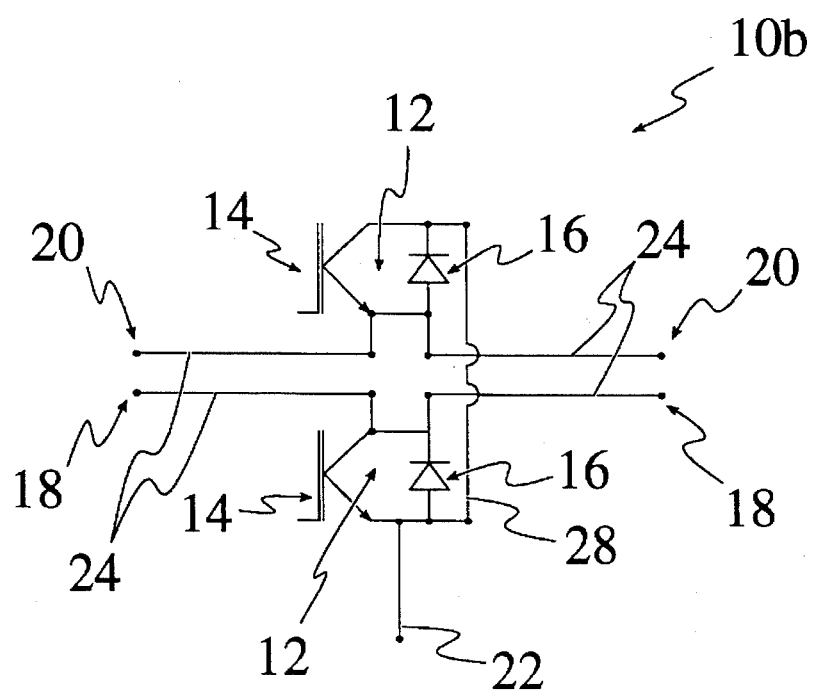
FIG. 2 shows a second design of the circuit arrangement for power semiconductor components.

Referring to FIG. 2, a bridge circuit 10b including power semiconductor components 12, is shown. The interconnection of elements of bridge circuit 10b of FIG. 2 is identical to that of FIG. 1, but the spatial arrangement of the elements is different. In addition, bridge circuit 10b of FIG. 2 includes only two partial connections 24 leading to positive and negative power connections 18 and 20. As in bridge circuit 10a of FIG. 1, an AC load is connected to a junction between power semiconductor components 12 at AC load connection 22.

A bilaterally symmetric configuration of bridge circuit 10b can be obtained by positioning power connections 18 and 20 of the voltage source centrally between power semiconductor components 12. Note that in bridge circuit 10b, the positive and negative power connections 18 and 20 consist of multiple partial connections 24 as in bridge circuit 10a. In this case, each of a pair of partial connections 24 extends from the junction between power semiconductor components 12 in a direction opposite that of the other of the pair. Power semiconductor components 12 are in a substantially central location between respective ends of each oppositely extending pair of partial connections 24.

With the configuration of bridge circuit 10b of FIG. 2, the inductive over-voltage induced in power connections 18 and 20 is reduced by half compared to that induced in a circuit with a single conductor. This reduction in over-voltage lowers the stress on IGBTs 14, free-running diodes 16 or any other circuit components of power semiconductor components 12.

The invention reduces induction problems in a power semiconductor circuit by employing multiple conductors for power connections 18 and 20. The partial connections reduce the total current to a fraction of that of a connection consisting of a single conductor. This fraction is substantially equal to the inverse of the number of partial connections 24. The time gradient of the total current in each of power connections 18 and 20 is accordingly reduced to the fraction. Since the inductive voltage drop of a power connection is proportional to its inductance and the rate of current change, the invention provides a corresponding reduction in the induction of power connections 18 and 20 and therefore, the voltage drop in power connections 18 and 20.

If the self-inductance of each of partial connections 24 is L, the number of partial connections 24 is n and the total current in power connections 18 and 20 is i, each partial connection contains a current of i/n. Assume the rate of current change in each power connection 18 or 20 is di/dt. If power connection 18 or 20 consists of a single conductor with inductance L, the voltage drop due to induction is:

$L \cdot di/dt$.

With n partial connections 24, the voltage drop in power connection 18 or 20 is:

$(1/n) \cdot L \cdot di/dt$.

Thus, if two partial connections are used, only half the over-voltage of the single power connection results.

It is particularly effective to arrange the positive and negative power connections of the voltage source side by side and in close proximity, as in bridge circuit 10b. As shown in FIG. 2, the close proximity can be obtained by arranging pairs of partial connections 24 in a substantially central location. The partial connections are located between power semiconductor components 12 with each partial connection of each pair extending in opposite directions. Each pair runs in a substantially parallel line. This results in a symmetrical design of the circuit arrangement with low inductance and thus, a low inductive voltage drop. With this arrangement, the symmetry of bridge circuit 10b is optimized. This symmetry has the advantage of minimizing the inductive voltage drop, and thus the over-voltages, induced by rapid current variation in power connections 18 and 20.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A power semiconductor device, comprising:

a first power semiconductor component having a first terminal and a second terminal;

a first connection between said first terminal and a negative voltage source;

a second power semiconductor component having a third terminal and a fourth terminal;

a second connection between said third terminal and a positive terminal of a voltage source;

said second and fourth terminals being connected in common to an unsteady load;

said first connection including at least two separate conductors, connected in parallel between said first terminal and said negative voltage source;

said second connection including at least two other separate conductors, connected in parallel between said third terminal and said positive voltage source; and, wherein said first negative power connection and said second positive power connection reduce inductivity at each of said at least two partial connections.

2. Apparatus as in claim 1, wherein each of said first and second power semiconductor components includes an insulated gate bipolar transistor.

3. Apparatus as in claim 1, wherein said unsteady load is an alternating current load.

4. Apparatus as in claim 1, wherein each of said first and second power semiconductor components includes a diode.

5. Apparatus as in claim 1, wherein said first connection, said first power semiconductor component, said second power semiconductor component and said second connection are arranged substantially in a row.

6. Apparatus as in claim 1, wherein:

first and second ones of said at least two separate conductors lead in opposite directions away from said terminal thereby substantially defining a first line;

first and second ones of said at least two other separate conductors lead in opposite directions away from said third terminal thereby substantially defining a second line;

said first and second lines are substantially straight;

said first line is substantially parallel to said second line; and said first line is substantially close to said second line.

7. Apparatus as in claim 6, wherein said first and second lines are located substantially between said first and second power semiconductor components.

8. Apparatus as in claim 6, wherein each of said first and second power semiconductor components includes an insulated gate bipolar transistor.

9. Apparatus as in claim 6, wherein each of said first and second power semiconductor components includes a diode.

10. Apparatus as in claim 6, wherein said unsteady load is an alternating current load.

11. A power semiconductor bridge circuit, comprising:

a first power semiconductor component having a first terminal and a second terminal;

a second power semiconductor component having a third terminal and a fourth terminal;

said second and fourth terminals being connected in common to an unsteady load;

a first conductive element connected at ends thereof to a negative voltage source; a second conductive element connected at ends thereof to a positive voltage source;

said first conductive element being connected at an intermediate point thereof to said first terminal;

said second conductive element being connected at an intermediate point thereof to said third terminal;

said first and second conductive element are disposed in close proximity to and oppose each other; and said first and second conductive elements being arranged coplanar with said first and second power semiconductor components.

12. Apparatus as in claim 11, wherein each of said two power semiconductor components includes an insulated gate bipolar transistor.

13. Apparatus as in claim 11, wherein each of said two power semiconductor components includes a diode.

14. Apparatus as in claim 11, wherein said unsteady load is an alternating current load.

* * * * *